(12) United States Patent
Vasanth et al.

(10) Patent No.: US 6,388,288 B1
(45) Date of Patent: May 14, 2002

(54) INTEGRATING DUAL SUPPLY VOLTAGES USING A SINGLE EXTRA MASK LEVEL

(75) Inventors: Karthik Vasanth, Dallas; Sharad Saxena, Richardson; Richard G. Burch, McKinney; Purnendu K. Mozumder, Plano; Joseph C. Davis, Allen, all of TX (US); Chenjing L. Fernando, Lyndhurst, OH (US); Suraj Rao, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/276,783

(22) Filed: Mar. 25, 1999

Related U.S. Application Data

(60) Provisional application No. 60/079,833, filed on Mar. 30, 1998.

(51) Int. Cl.$^7$ .................................................. H01L 29/76
(52) U.S. Cl. ..................... 257/344; 257/336; 257/344; 257/500; 438/231; 438/232; 438/275; 438/276; 438/199
(58) Field of Search ..................... 257/336, 344, 257/500; 438/199, 231, 232, 275, 276

(56) References Cited

U.S. PATENT DOCUMENTS

| | | | | |
|---|---|---|---|---|
| 5,606,191 A | * | 2/1997 | Wang ........................... | 257/336 |
| 5,757,045 A | * | 5/1998 | Tsai et al. .................... | 257/336 |
| 5,827,747 A | * | 10/1998 | Wang et al. ................. | 438/199 |
| 5,841,174 A | * | 11/1998 | Arai ............................ | 257/392 |
| 5,844,276 A | * | 12/1998 | Fulford, Jr. et al. ........ | 257/336 |
| 5,977,586 A | * | 11/1999 | Crizensa et al. ............ | 257/326 |
| 5,977,591 A | * | 11/1999 | Fratin et al. ................ | 257/344 |
| 5,982,001 A | * | 11/1999 | Wu .............................. | 257/344 |
| 5,834,352 A | * | 6/2000 | Choi ........................... | 438/275 |
| 6,077,736 A | * | 6/2000 | Hwang et al. .............. | 438/231 |

\* cited by examiner

*Primary Examiner*—Eddie Lee
*Assistant Examiner*—Edgardo Ortiz
(74) *Attorney, Agent, or Firm*—Jacqueline J. Garner; Wade James Brady, III; Frederick J. Telecky, Jr.

(57) ABSTRACT

Integration of dual voltages on a single chip can be accomplished with a minimum of extra masks by optimizing only the MDD implant of the peripheral transistors, while other implants remain the same for both transistor types. This meets lifetime specifications without unnecessary expense.

18 Claims, 3 Drawing Sheets

FIG. 1

```
100 — FORM ISOLATION STRUCTURES
          ↓
110 — MASK PMOS TRANSISTORS; PERFORM
      CHANNEL IMPLANTS FOR ALL NMOS TRANSISTORS
      MASK NMOS TRANSISTORS; PERFORM
      CHANNEL IMPLANTS FOR ALL PMOS TRANSISTORS
          ↓
120 — FORM GATE STRUCTURES
          ↓
130 — MASK PMOS AND HV-NMOS TRANSISTORS;
      PERFORM DRAIN EXTENSION
      IMPLANTS FOR LV-NMOS TRANSISTORS
          ↓
140 — MASK PMOS AND LV-NMOS TRANSISTORS;
      PERFORM DRAIN EXTENSION
      IMPLANTS FOR HV-NMOS TRANSISTORS
          ↓
150 — MASK NMOS TRANSISTORS; PERFORM DRAIN
      EXTENSION IMPLANTS FOR PMOS TRANSISTORS
          ↓
160 — FORM SIDEWALL SPACERS
      MASK PMOS TRANSISTORS; PERFORM SOURCE/
      DRAIN IMPLANTS FOR NMOS TRANSISTORS
      MASK NMOS TRANSISTORS; PERFORM SOURCE/
      DRAIN IMPLANTS FOR PMOS TRANSISTORS
          ↓
170 — FORM SILICIDE CONTACTS
```

| SIMULATED VALUES | | | | | | |
|---|---|---|---|---|---|---|
| SET: IMPLANT VARIED | Idrive (NOM) μA/μm | Ioff (STRONG) A/μm | THRESHOLD VOLTAGE (STRONG) | PEAK Isub (NOM) μA/μm | LIFE TIME (NOM) YEARS | Cgate (NOM)* |
| CFC SPECIFICATION | > 400 | < 1e-11 | > 0.5V | <0.5 | > 1 | < 1.40 |
| MDD (SET 1) | 478 | < 1e-11 | 0.71V | 0.27 | 2.58 | 1.24 |
| MDD (SET 2) | 480 | < 1e-11 | 0.73V | 0.3 | 1.96 | 1.00 |
| Vt, Pt (SET 3) | 438 | < 1e-11 | 0.60V | 0.46 | 1.26 | 1.20 |
| Vt, (SET 4) | 413 | < 1e-11 | 0.64V | 0.60 | 0.62 | 1.18 |

*$C_{gate} = (C_{ox} \cdot L)/(C_{ox_{DPI}} \cdot L_{DPI})$

FIG. 2A

| TEST VALUES | | | | | | |
|---|---|---|---|---|---|---|
| SET: | Idrive (NOM) µA/µm | Ioff (STRONG) A/µm | THRESHOLD VOLTAGE (STRONG) | PEAK Isub (NOM) µA/µm | LIFE TIME (NOM) YEARS | Cgate (NOM)* |
| ALL IMPLANTS IDENTICAL | 450 | < 1e-11 | DATA NOT AVAILABLE | 1.76 | < 0.1 | 1.0 |
| MDD OPTIMIZED | 407 | < 1e-11 | DATA NOT AVAILABLE | 1.0 | ~1 | 1.0 |
*FIG. 2B*
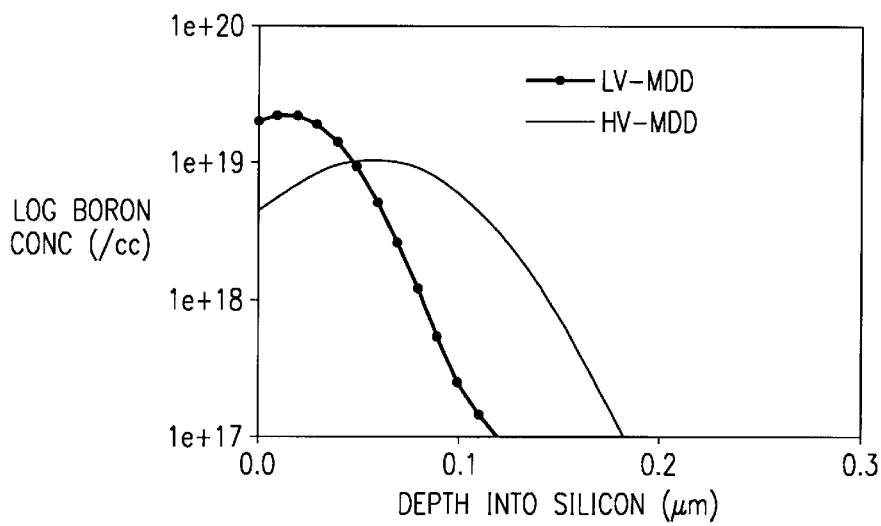
*FIG. 3A*
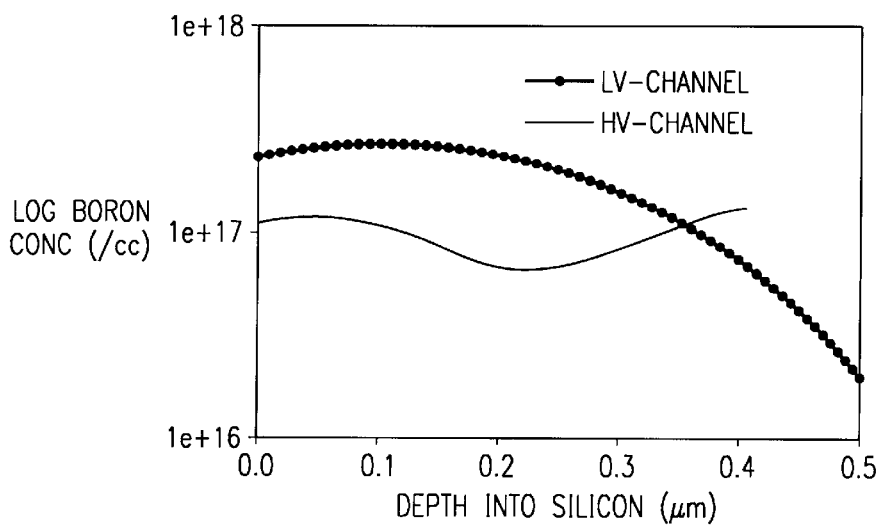
*FIG. 3B*

INTEGRATING DUAL SUPPLY VOLTAGES USING A SINGLE EXTRA MASK LEVEL

This application claims benefit of Prov. No. 60/079,833 filed Mar. 30, 1998.

BACKGROUND AND SUMMARY OF THE INVENTION

The present application concerns integrated circuits, especially the structures and processes necessary to integrate dual supply voltages onto a single chip.

Background: Drain Profile Engineering

One of the long-standing problems in submicron field effect transistors is hot carrier effects. In an old-fashioned NMOS single-drain-diffusion transistor structure, the potential energy (voltage) of an electron changes dramatically as it crosses the boundary of the N+ drain diffusion. This sharp change in potential energy, over a short distance, defines a high electric field value, which is undesirable because it causes the electrons (and to a much lesser extent, holes) to behave in a different way within the semiconductor lattice. Electrons which have been activated in this way by high electric fields are referred to as "hot electrons." Such electrons can, for example, penetrate into or through the gate dielectric, and can cause the gate dielectrics to become charged up over time, until the transistor fails in service.

One technique to avoid hot carrier effects is lightly doped drain extension regions, or "LDD" regions. In this structure, a first light and shallow implant is performed before sidewall spacers are formed on the gate structure, with a second heavier implant afterwards to form the source/drain. The first implant provides only a relatively low conductivity in the silicon, but prevents the channel-drain voltage difference from appearing entirely at the drain boundary. By increasing the distance over which this voltage difference occurs, the peak electric field is reduced, and this tends to reduce channel hot carrier ("CHC") effects.

The trade-off as lighter-doped regions are introduced into the process is that transistor performance decreases due to the increased resistance, so the chip designer seeks to find a balance between these two opposing demands. In more recent years, with device sizes shrinking and voltages dropping, the doses needed for LDD regions have become closer to those used for the main source/drain implant, so that these implants are now referred to as "MDD" (medium-doped drain) regions.

Background: Dual-Voltage Chip Architectures

As integrated circuit geometries have shrunk below one micron, the possibility of using two supply voltages has appeared increasingly attractive. In this process option, the central part of a chip (the "core", which performs the actual electrical functionality which is desired from the chip) can be fully optimized for the current state of process engineering for packing density and highest performance, without regard to the voltage standards required for interfacing to the external world. Since many different chips must communicate, the voltage standard required for external interface tend to change relatively slowly. As of 1997, there was no standard signal level below 3.3 volts which is in really widespread usage, whereas the internal voltages of chips in production or announced are very commonly 2.5 volts, 2 volts, or below.

Thus, process optimization for a dual-voltage chip presents some important problems. First, the use of two different voltages demands that different gate oxide thicknesses be used for the core and peripheral transistors. Second, the basic process design should be determined, as far as possible, by optimization of the core devices, since this is the large majority of the area of the chip; the question is then how to modify the basic optimized process to achieve adequate reliability and performance in the peripheral devices. Of course, this must be done while avoiding such problems as CHC effects and punchthrough.

Since each variation between implants received by the core and peripheral transistors requires the use of two separate masks, optimizing both sets of transistors requires 4–5 additional masks, and is not a cost-effective option. However, tests using identical implants for both the low voltage and high voltage devices, while preferable from a fabrication standpoint, do not provide high-voltage transistors which meet the necessary lifetime and performance specifications. The high MDD necessary for the core transistors causes the peripheral transistors to have too high an electrical field, even though the oxide thickness is increased for these transistors. In fact, a 50% reduction in Idrive was required in testing to obtain the desired CFC lifetime specification for this option.

Dual Voltage Process and Structure

The present invention provides a very simple and flexible approach to fabrication and structure of dual-voltage integrated circuits. The inventors have discovered that integration of a dual voltage process can be accomplished by separately optimizing only the gate length and gate oxide thickness (which were already being done) and the drain extension (LDD or MDD) implant, while other implants remain the same for the two transistor types. This integration process requires the use of only 1 additional mask beyond the mask for separate gate oxides.

One method of separately optimizing the drain extension of the HV transistors is to give this implant a higher energy and lower dose than that of the core device. This gives improved hot carrier resistance and reduced substrate current, due to the peak electric field of the device being moved farther from its surface. This specific modification is not required, however. Since the drain extension implant is optimized for both types of NMOS transistor, a different species of dopant can also be used, or other implant conditions changed.

Advantages of the disclosed structures and methods include the following:

reduces substrate current in HV transistors by more than a factor of 2 in experiments;

uses only 1 additional mask over the mask required for different gate oxide thickness;

cheap to implement;

peak electrical field of HV transistor is subsurface;

no loss in performance.

improves CHC life time;

meets CHC lifetime specifications.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 shows a partial flowchart of the formation of transistor structures using the disclosed process.

FIG. 2A shows a table of desired values and simulated values in tests of transistors made under the conditions of FIGS. 1A–1D, while FIG. 2B shows the values for actual tests run using the disclosed method.

FIG. 3A shows the MDD implant profile of the I/O transistors vs the core transistors for tests in which only the MDD implant was varied between the two types of transistors.

FIG. 3B shows the channel implant profile for the I/O transistors vs the core transistors for tests in which both the Vt and Pt implants were varied between the two types of transistors.

DETAILED DESCRIPTION OF THE PREFERRED EMBODIMENTS

The numerous innovative teachings of the present application will be described with particular reference to the presently preferred embodiment (by way of example, and not of limitation).

Overview

Figure 4:
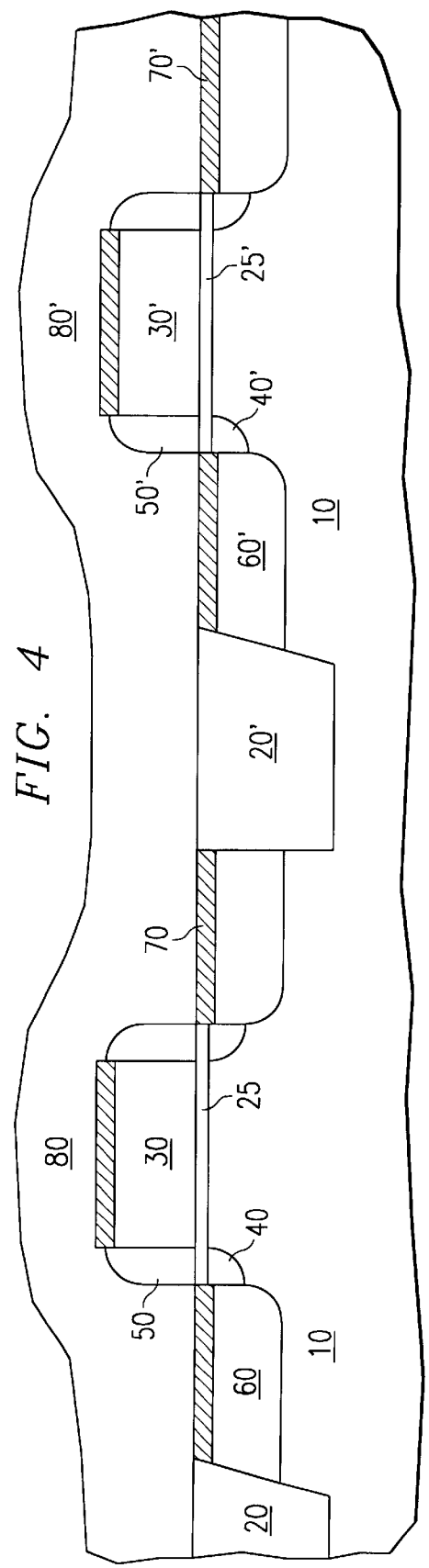
FIG. 4 shows a cross-section of a pair of partially formed CMOS transistors.

FIG. 1 shows a partial flowchart of the formation of transistor structures using the disclosed process, which will now be discussed with reference to FIG. 4, which shows the cross-section of MOS transistors wherein the transistor with unprimed character references is the high voltage transistor and the transistor with primed character references is the low voltage transistor with like numbers representing like structure. PMOS transistors do not have as great a problem with channel hot carriers as do the NMOS transistors, so it is generally not necessary to separately optimize the implants of the HV and core PMOS transistors. In this disclosure, it is assumed that the steps for PMOS transistors are unchanged from usual processing, although this method can be used with the PMOS transistors if the need arises to prevent CHC problems.

Isolation structures 20 are formed on a substrate 10 (step 100). These may be LOCOS isolation, shallow trench isolation (STI), or other forms of isolation, and their formation is followed by the formation of NMOS and PMOS transistors. Although the flow discloses that NMOS devices are created first, this is, of course, not necessary. Channel dopings (not shown) are separately performed for both NMOS and PMOS transistors (step 120), to adjust the turn-on voltage of the transistor and to prevent punchthrough. Gate oxides 25 are separately formed for core and peripheral transistors by either thermal growth or deposition, and gates 30 are formed (step 120), generally by deposition and patterned etch of a layer of polysilicon, although, of course, this can be a layered structure, or use different materials. By modifying the mask used to create the gates, the size of each type of transistor can be separately optimized without affecting process flow.

Drain extension implants 40 (e.g. MDD implants) are performed separately for the core NMOS transistors (step 130), the HV-NMOS transistors (step 140), and the PMOS transistors (step 150). These can, of course, be done in either order. Specific examples of the separate optimizations for each transistor type are given below. Sidewall spacers 50 are then formed on the transistors, and source/drain implants 60 are performed separately for the NMOS transistors and for the PMOS transistors (step 160).

A silicide 70 is then formed (step 170) on the upper surface of the gate and on the source/drain areas to provide contact areas, Processing then continues with deposition of dielectric layer 80 and metallization to provide the desired connections to the transistors.

First Embodiment

According to this disclosure, the HV transistor receives a drain extension implant which is a higher energy and a lower dosage than that received by the LV transistor. For example, the LV transistor receives an arsenic implant of 8e14 at 15 keV, while the HV transistor receives an arsenic implant of 1e14 at 80 keV.

Second Embodiment

In this embodiment, the MDD of the two NMOS transistor types are separately optimized using different dopant species. As an example, for the core transistor discussed above, the HV transistor can receive an MDD implant of 4e13 at 25 keV (P) plus 2e13 at 45 keV (As). Other parameters for both the first and second embodiments, e.g., channel and source/drain implants, are shown in the simulation data below.

Simulation Data

Simulations with the following conditions were performed to determine the best means to meet the required specifications. These simulations are for a CMOS process where the peripheral input/output transistors are connected to a voltage of 3.3, while core transistors receive 2.5 volts. In these simulations, the source/drain implants were 1.5e15 at 70 keV of arsenic plus 1.5e14 at 40 keV of phosphorus.

In a first simulation, channel doping is the same for both the core and the peripheral transistors, (e.g., the Vt implant to adjust the threshold voltage is 4e12 at 20 keV of boron, and the Pt implant to prevent punchthrough is 6.5e12 at 70 keV of boron. The gate length L, the oxide thickness Tox, and the medium-doped drain implant (MDD) are varied between the two transistors, as shown below. A comparison between the MDD implant profile for the high voltage and low voltage transistors is seen in FIG. 3A, where the HV transistor is seen to have a lower concentration, but a deeper penetration into the substrate.

| Set 1 | L | Tox | MDD (As) |
| --- | --- | --- | --- |
| LV transistor | 0.25 micron | 6.0 nm | 3e14 at 15 keV |
| HV transistor | 0.41 micron | 7.3 nm | 1e14 at 80 keV |

In a second simulation, the channel doping is the same as above for both core and peripheral transistors, while the channel length and oxide thickness were varied from the values of the first simulation. Only the MDD implant is optimized for each type transistor. Since the MDD implant conditions are the same for sets 1 and 2, the graph of FIG. 3A applies to this set also.

| Set 2 | L | Tox | MDD (As) |
| --- | --- | --- | --- |
| LV transistor | 0.25 micron | 6 nm | 3e14 at 15 kev |
| HV transistor | 0.36 micron | 8 nm | 1e14 at 80 keV |

In a third simulation, the MDD implant of the LV transistor above was used in both types of transistors, while L, Tox and both channel implants were optimized for the transistor type. FIG. 3B is a graph of the comparison of doping profile for the channel region of the higher voltage and lower voltage transistors.

| Set 3 | L | Tox | Vt (boron) | Pt (boron) |
|---|---|---|---|---|
| LV | 0.25 | 6.0 nm | 4e12 at 20 keV | 6.5e12 at 70 keV |
| HV | 0.46 | 8.5 nm | 3e12 at 15 keV | 6.75e12 at 195 keV |

Figure 3C:
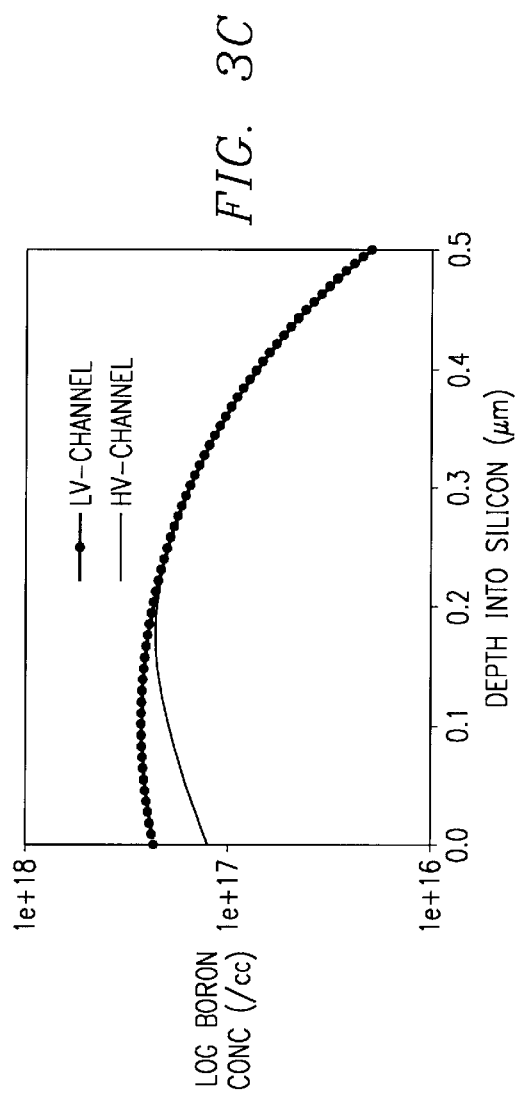
FIG. 3C shows the channel implant profile for I/O transistors vs the core transistors for tests in which the only the Vt implant was varied between the two types of transistors.

In a fourth simulation, the MDD and Pt implants were the same as the LV transistor in both transistor types, while L, Tox and the Vt implant were varied. FIG. 3C graphically shows the doping profiles of the two transistor types.

| Set 4 | L | Tox | Vt (boron) |
|---|---|---|---|
| LV | 0.25 | 6.0 nm | 4e12 at 20 keV |
| HV | 0.46 | 8.7 nm | 1.1e12 at 36 keV |

FIG. 2 gives the results from these simulations as compared to the specifications for the chip. Note that in both cases shown, optimizing the MDD implant regions provides significant improvement in lifetime over the other two options, as it meets both core and HV device specifications. The MDD solutions appear to provide this improvement by moving the peak electric field deeper into the silicon substrate.

Test Data

Using the simulations as guidelines, the inventors ran a comparison test to verify that the disclosed method works. Two chips were designed to use 3.3 volts for the peripheral transistors, with 2.5 core transistors. Additionally, in both chips, the core transistors had a gate length of 0.25 micron and a gate oxide thickness of 6 nm, while the peripheral transistors had a gate length of 0.36 micron and a gate oxide thickness of 8 nm. In the first chip, both sets of transistors received implants identical to the core transistors of set 2 above, including an MDD implant of 3e14 at 15 keV of arsenic. In the second chip, the peripheral transistors received the same implants as the core transistors, EXCEPT for the MDD implant, in which an HV-MDD implant of 1e14 at 80 keV of arsenic gave these transistors the lighter, deeper implant disclosed above. The results of this test are shown in FIG. 5.

According to a disclosed class of innovative embodiments, there is provided: An integrated circuit device structure, comprising: first and second pluralities of transistors of a first conductivity type, wherein all dopant diffusions of said first and second plurality of transistors are identical, except for drain extension diffusions.

Within this embodiment, at least some subsets can have (a.) a gate oxide underlying said second plurality of transistors which is thicker than a gate oxide underlying said first plurality of transistors, (b.) said second plurality of transistors is connected to receive a higher voltage than said first plurality of transistors, and/or (c.) the dopant profile of said drain extension diffusions of said second plurality of transistors contains at least one species of dopant which is not present in the dopant profile of said drain extension diffusions of said first plurality of transistors.

According to another disclosed class of innovative embodiments, there is provided: A fabrication method for an integrated circuit, comprising the step of forming a first plurality of transistors and a second plurality of transistors having identical diffusions except for drain extension diffusions, which do not have the same profile.

Within this embodiment, at least some subsets further comprise the step of performing a split oxidation process to form first and second gate oxides, wherein said first oxide is thicker than said second oxide and/or further comprise the step of driving said first plurality of gate structures with a higher voltage than said second plurality of gate structures.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course, additional implants and process steps can optionally be used to further modify the drain profile, and it should be noted that the following claims do not preclude the presence of other features which may alter the drain profile.

What is claimed is:

1. An integrated circuit device structure, comprising:
   a first transistor of a first conductivity type operable at a first predetermined supply voltage;
   a second transistor of said first conductivity type operable at a second predetermined supply voltage different from said first predetermined supply voltage;
   said first transistor and said second transistor having source dopant diffusions, drain dopant diffusions and drain extension dopant diffusions;
   said source and drain dopant diffusions of said first transistor and said second transistor being substantially identical and said drain extension dopant diffusion of said first transistor being different from said drain extension dopant diffusion of said second transistor.

2. The integrated circuit of claim 1, wherein each of said first and second transistors has a gate and a gate oxide underlying said gate, the gate oxide underlying said second transistor being thicker than the gate oxide underlying said first transistor.

3. The integrated circuit of claim 1, wherein said second transistor is connected to receive a higher voltage than said first transistor.

4. The integrated circuit of claim 1, wherein the dopant profile of said drain extension dopant diffusion of said second transistor contains at least one species of dopant which is not present in the dopant profile of said drain extension dopant diffusion of said first transistor.

5. The integrated circuit of claim 2, wherein said second transistor is connected to receive a higher voltage than said first transistor.

6. The integrated circuit of claim 2, wherein the dopant profile of said drain extension dopant diffusion of said second transistor contains at least one species of dopant which is not present in the dopant profile of said drain extension dopant diffusion of said first transistor.

7. The integrated circuit of claim 3, wherein the dopant profile of said drain extension dopant diffusion of said second transistor contains at least one species of dopant which is not present in the dopant profile of said drain extension dopant diffusion of said first transistor.

8. The integrated circuit of claim 4, wherein the dopant profile of said drain extension dopant diffusion of said second transistor contains at least one species of dopant which is not present in the dopant profile of said drain extension dopant diffusion of said first transistor.

9. The integrated circuit of claim 5, wherein the dopant profile of said drain extension dopant diffusion of said second transistor contains at least one species of dopant which is not present in the dopant profile of said drain extension dopant diffusion of said first transistor.

10. The integrated circuit of claim 1 further including a plurality of said first and second transistors.

11. The integrated circuit of claim 2 further including a plurality of said first and second transistors.

12. The integrated circuit of claim 3 further including a plurality of said first and second transistors.

13. The integrated circuit of claim 4 further including a plurality of said first and second transistors.

14. The integrated circuit of claim 5 further including a plurality of said first and second transistors.

15. The integrated circuit of claim 6 further including a plurality of said first and second transistors.

16. The integrated circuit of claim 7 further including a plurality of said first and second transistors.

17. The integrated circuit of claim 8 further including a plurality of said first and second transistors.

18. The integrated circuit of claim 9 further including a plurality of said first and second transistors.

* * * * *